June 26, 1973 MASAICHI SHINODA ET AL 3,741,826

METHOD OF MANUFACTURING VARIABLE CAPACITANCE DIODES

Original Filed Aug. 28, 1970

United States Patent Office 3,741,826

Patented June 26, 1973

3,741,826

METHOD OF MANUFACTURING VARIABLE CAPACITANCE DIODES

Masaichi Shinoda, Sagamihara, and Masaru Igarashi, Yokohama, Japan, assignors to Fujitsu Limited, Kawasaki, Japan Continuation of abandoned application Ser. No. 663,639, Aug. 28, 1967. This application Sept. 18, 1970, Ser. No. 73,641

Claims priority, application Japan, Aug. 29, 1966, 41/56,824

Int. Cl. H01l 7/46

U.S. Cl. 148—178 4 Claims

ABSTRACT OF THE DISCLOSURE

Described is a variable capacitance diode with hyperabrupt junction and the method of manufacture thereof. The diode comprises an n-type germanium wafer, onto which a dot has been alloy diffused. The dot comprises bismuth with from 0.01 to 10% by weight of gallium. A small amount of an n-type impurity such as antimony or arsenic may be added.

The present application is a continuation of application Ser. No. 663,639, filed Aug. 28, 1967, now abandoned.

This invention relates to variable capacitance diodes (varactors) and particularly to a method of manufacturing variable capacitance diodes having hyper abrupt junction.

In the manufacture of semiconductor devices, for example variable capacitance diodes, it is often necessary to provide a PN junction having a diffusion layer of low concentration in relation to the breakdown voltage. The surface diffusion method generally used in the manufacture of a diffusion distribution involves difficulties, particularly when the concentration is low and it has virtually been infeasible to apply this method when the concentration is as low as about $10^{16}$–$10^{17}$ atoms per cm.$^3$, for example.

Since fortunately the alloying method can be readily applied to the processing of germanium, the alloy diffusion method has heretofore been applied even though it is not completely satisfactory. It is known from the technical literature that in germanium alloy diffusion, indium, aluminum and gallium are used for p-type diffusion; whereas antimony, arsenic, phosphorus are used for n-type. However, it is generally considered that only a limited number of combinations of the above metals can be used in practice. Furthermore, it is known that even some of these combinations cannot be utilized in practice.

Hitherto an alloy material comprising a mixture of an indium-lead alloy and a small amount of gallium and antimony has been used in practice. Using alloy material results in the n-type diffusion layer being created by the antimony and p-type layer being created by the gallium. Another method utilizes an alloy material comprising a mixture of lead with a small amount of gallium and antimony. The same results are obtained by both methods.

In other combinations of the above-mentioned impurities such as, for example, indium-antimony, indium-arsenic and indium-gallium-antimony, an n-type inversion layer is formed in a portion which must be p-type, a spread of above 100% is caused in the concentration of antimony or arsenic, the n-type impurities are not at all diffused when aluminum is used, or the distribution becomes extremely non-uniform, wherefore it is impossible to put these combinations to practical use.

On the other hand, in the lead-gallium-antimony and lead-indium-gallium-antimony combinations which are presently utilized, the concentration of the diffusion layer is determined by the amount of antimony included in these alloys. In general, a distribution layer of a concentration of about $10^{16}$–$10^{17}$/cc. can be made by including as little as 0.05% arsenic in an alloy material including antimony of about 1% (atom percent). And in the actual manufacture of an alloy of this kind, since the vapor pressures of these n-type impurities are high and the impurities readily evaporate, particularly since the amounts of impurities added are extremely small, the concentration of the antimony of arsenic in the completed alloy material is extremely diffused. This error results directly in error in the diffusion layer. As described above, the precision is very low as it is extremely difficult to control the concentration in the alloy material with high precision.

In addition to the above materials, gallium also can be utilized as a p-type impurity. However, if about 1% gallium is added, the "wetting" in the alloy process greatly deteriorates and the alloy is extremely unstable.

As described above, the conventional alloy diffusion method has various difficulties and defects, particularly when the diffusion is performed at a low concentration. These defects can be completely overcome in accordance with the instant invention as described below which moreover is characterized by its extreme simplicity. We form a hyper abrupt junction by alloy diffusion an alloy material comprising a 0.01–10%, by weight, mixture of gallium in bismuth into an n-type germanium, whereby it is possible to manufacture diodes with a concentration of the diffusion surface of about $10^{16}$–$10^{17}$ with an excellent stability.

It is well known that bismuth is an n-type impurity. However, few if any, attempts have been made to utilize bismuth positively as an n-type impurity. This is because there is little known data relating to bismuth as an impurity. In particular, the knowledge is lacking on the most important parameter, i.e. the solid phase solubility in germanium. The value of the solid phase solubility at the fusing or melting point of germanium is known but the solubility value at the temperature at which the element is actually processed is not known. As the result of a detailed study of this point, we have found that the saturated solid phase solubility is within the range of $10^{16}$–$10^{17}$/cc. when the temperatuure is 600° C–750° C. Moreover, since this solubility is the saturated solubility, it is absolutely guaranteed physically that the concentration will remain constant if the temperature only is kept constant. If gallium is to be used as the p-type impurities, it is desirable to mix gallium in bismuth by about 1% and the error caused by this does not exceed 1%.

In a practical embodiment, we have found that the spread of the concentration of bismuth is so small that it cannot be measured by the measuring means now available. Moreover, the impurities distribution type has a desirable form that follows Fick's law of diffusion. From this fact it is seen that there is scarcely any interaction between bismuth and gallium. Thus interaction in handling these impurities can be ignored. This results in the third advantage of our invention which provides low concentration and high precision and guarantees a high precision contrary to the generality that "wetting" is greatly deteriorated if gallium is added. When utilizing bismuth, the "wetting" is not greatly affected by gallium.

Because of the above, we can manufacture semiconductors as follows. We use an alloy material prepared by mixing gallium of 0.01–10% by weight and a small amount of n-type impurities of other kinds such as, for example, antimony or arsenic in bismuth. This alloy is diffused into germanium. The bismuth is also used as the carrier metal for controlling the concentrations of the other n-type impurities. It thus becomes possible to obtain an impurities diffusion of a concentration slightly higher than the maximum diffusion concentration of about $10^{17}$/cc. when using only bismuth. The best stability and other characteristics can be obtained when the concentration of gallium is 0.01%–10% (by weight).

Figure 1:
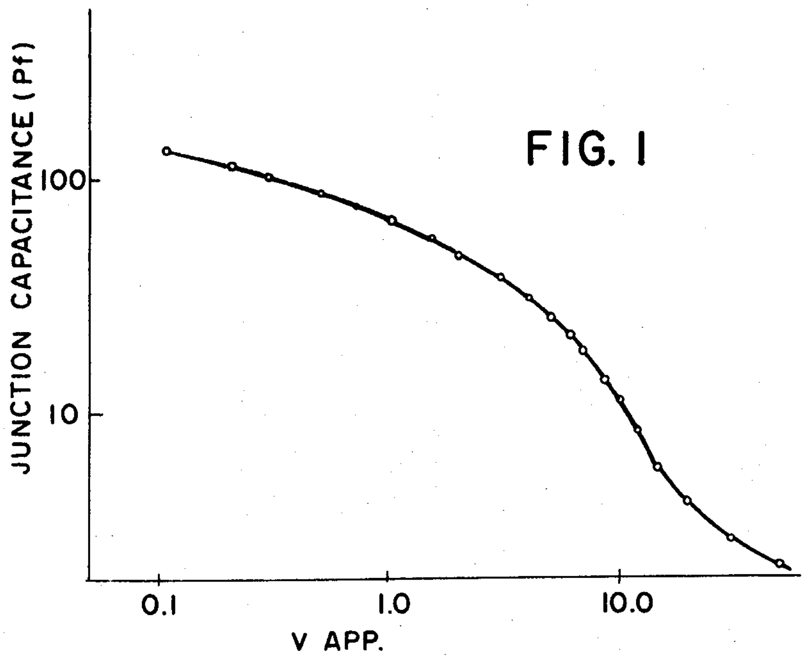
FIG. 1 shows the C–V characteristics using an alloy dot of 1% Ga in Bi for diffusion with Ge.

The invention will be further described with respect to specific embodiments making reference to the drawing.

FIG. 1 shows the C–V characteristic of the junction available when alloy diffusing a dot comprising a 1% mixture of gallium in bismuth into n-type germanium of 6Ω cm. for 65 minutes at 680° C. As is seen from this diagram, a highly stable C–V characteristic can be obtained and the maximum concentration of the n-type is $10^{16}$ cm.$^{-3}$.

Figure 2:
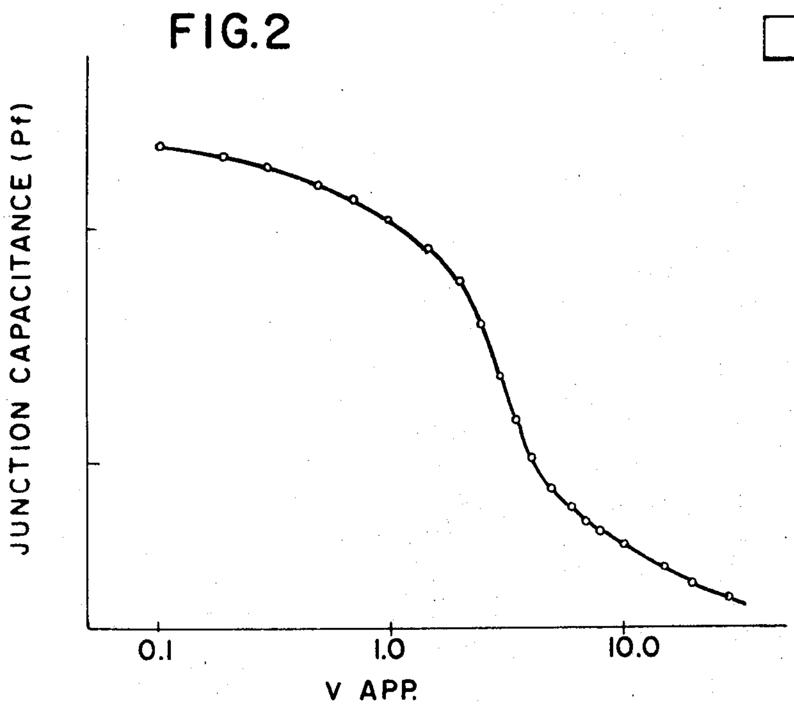
FIG. 2 shows the C–V characteristics using an alloy dot of 0.5% Sb and 1% Ga in Bi for diffusion into Ge.

FIG. 2 shows the C–V characteristic obtained when alloy diffusing a dot made by mixing 0.5% antimony and 1% gallium in bismuth for 15 minutes at 650° C. In this case, the maximum concentration of the n-type is about $6\times10^{16}$ cm.$^{-3}$. In both of these embodiments, the alloy surfaces have high stability, and stable characteristics can be obtained.

Figure 3:
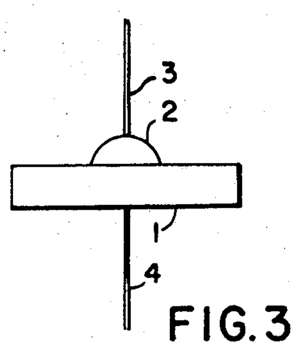
FIG. 3 shows a variable capacitance diode.

FIG. 3 shows a variable capacitance diode prepared in accordance with our invention. In the drawing, an n-type germanium wafer has alloyed onto a dot 2 consisting of 1% gallium by weight in bismuth. The wafer is about 1.9 mm. x 1.9 mm. x 40 μm., and the dot is from 100 to 600 μm. in diameter. Electrodes 3 and 4 are respectively attached to the dot and wafer.

Only some of the possible practical embodiments of this invention have been described above. For example, the temperature may vary between 500° C. and 770° C. with completely the same result available. The antimony concentration may be increased up to about 3% with similar effect.

As described above, the method of this invention has an advantage that a stable alloy diffusion can be performed even when the concentration is high to some extent. Our invention makes it possible to obtain a variable capacitance diode having a diffusion layer of a low concentration wherein, moreover, the wetting between the metal and the semiconductor is excellent. Furthermore, our invention provides an extremely novel device wherein an n-type material is used as the carrier in contradistinction to the conventional devices wherein a neutral or p-type material is used as the carrier material.

What is claimed is:

1. A method of manufacturing variable capacitance diodes having a hyperabrupt junction, which comprises alloy diffusing an alloy material comprising a 0.01 to 10% by weight mixture of gallium in bismuth into n-type germanium, at a temperature from 600° C. to 750° C. to give a bismuth diffusion concentration of $10^{16}$–$10^{17}$ atoms/cm.$^3$ in said germanium.

2. The method of claim 1, wherein the alloy material contains a small amount of n-type impurities.

3. The method of claim 2, wherein the alloy material contains antimony.

4. The method of claim 3, wherein antimony is present in the amount from 0.5 to 3%.

References Cited

UNITED STATES PATENTS 3,078,397 2/1963 Tummers et al. ------ 148—185
3,243,325 3/1966 Shinoda ------------ 148—185

RICHARD O. DEAN, Primary Examiner

U.S. Cl. X.R.

148—185